(12) United States Patent
Theuwissen

(10) Patent No.: US 8,853,756 B2
(45) Date of Patent: Oct. 7, 2014

(54) ARRAY OF PIXELS WITH GOOD DYNAMIC RANGE

(71) Applicant: Albert Theuwissen, Bree (BE)

(72) Inventor: Albert Theuwissen, Bree (BE)

(73) Assignee: Harvest Imaging bvba (BE)

( * ) Notice: Subject to any disclaimer, the term of this patent is extended or adjusted under 35 U.S.C. 154(b) by 0 days.

(21) Appl. No.: 13/855,115

(22) Filed: Apr. 2, 2013

(65) Prior Publication Data

US 2013/0256768 A1 Oct. 3, 2013

(30) Foreign Application Priority Data

Apr. 2, 2012 (EP) .................................. 12162914

(51) Int. Cl.
*H01L 31/062* (2012.01)
*H01L 31/113* (2006.01)
*H01L 27/146* (2006.01)
*H04N 3/14* (2006.01)
*H04N 5/359* (2011.01)
*H04N 5/357* (2011.01)

(52) U.S. Cl.
CPC ........ *H01L 27/14612* (2013.01); *H04N 3/1568* (2013.01); *H04N 5/359* (2013.01); *H04N 5/357* (2013.01)
USPC ............. 257/292; 257/72; 257/258; 348/294; 348/302

(58) Field of Classification Search
USPC ...................... 257/72, 258, 292; 348/294, 302
See application file for complete search history.

(56) References Cited

U.S. PATENT DOCUMENTS

| 8,093,541 | B2 * | 1/2012 | Chen .......................... 250/208.1 |
| 2007/0023614 | A1 * | 2/2007 | Park et al. .................. 250/214.1 |
| 2008/0151091 | A1 * | 6/2008 | Hynecek ....................... 348/308 |
| 2008/0164404 | A1 * | 7/2008 | Mansoorian ............... 250/208.1 |
| 2008/0197269 | A1 | 8/2008 | Hagihara |
| 2009/0189057 | A1 * | 7/2009 | Asaba et al. ................ 250/208.1 |
| 2009/0256156 | A1 * | 10/2009 | Hsieh .............................. 257/72 |
| 2012/0112039 | A1 * | 5/2012 | Sugano et al. ............. 250/208.1 |
| 2013/0027564 | A1 * | 1/2013 | Solhusvik ..................... 348/187 |

FOREIGN PATENT DOCUMENTS

EP 1178674 A1 2/2002

OTHER PUBLICATIONS

European Search Report and Opinion in corresponding EP12162914.1.

* cited by examiner

*Primary Examiner* — Phuc Dang
(74) *Attorney, Agent, or Firm* — Barnes & Thornburg LLP

(57) ABSTRACT

An array comprises a plurality of pixels logically arranged in rows and columns. The pixels comprise a photoreceptor (11) for converting impinging radiation into electronic charge, a transfer element (12) for transferring the electronic charge towards a sense node, a reset transistor (13) for resetting the sense node (16), means for converting the electronic charge onto the sense node (16) into a voltage, and for outputting the voltage as a pixel signal, and means adapted for biasing the sense nodes at a low voltage lower than a reset voltage which is meant to initialize the photoreceptor, during integration of impinging radiation on the photoreceptors. The means for converting and outputting comprise a source follower (14) for converting the electronic charge, and a select transistor (15) for outputting the voltage as a pixel signal, and the reset transistor of at least one pixel is coupled with one main electrode to the gate of the reset transistor of another pixel.

5 Claims, 7 Drawing Sheets

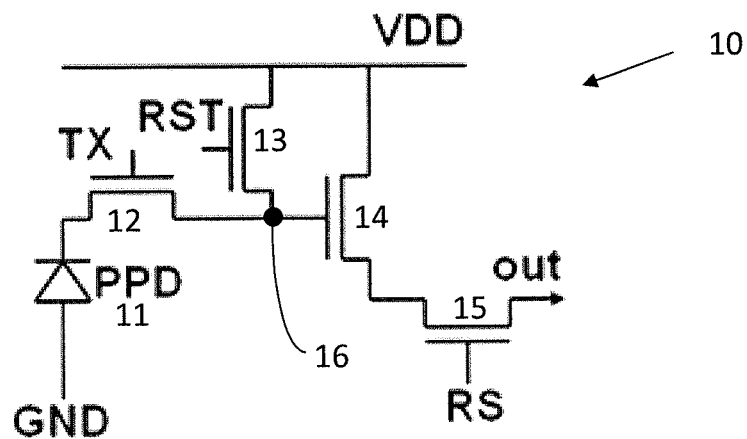
FIG. 1 – PRIOR ART
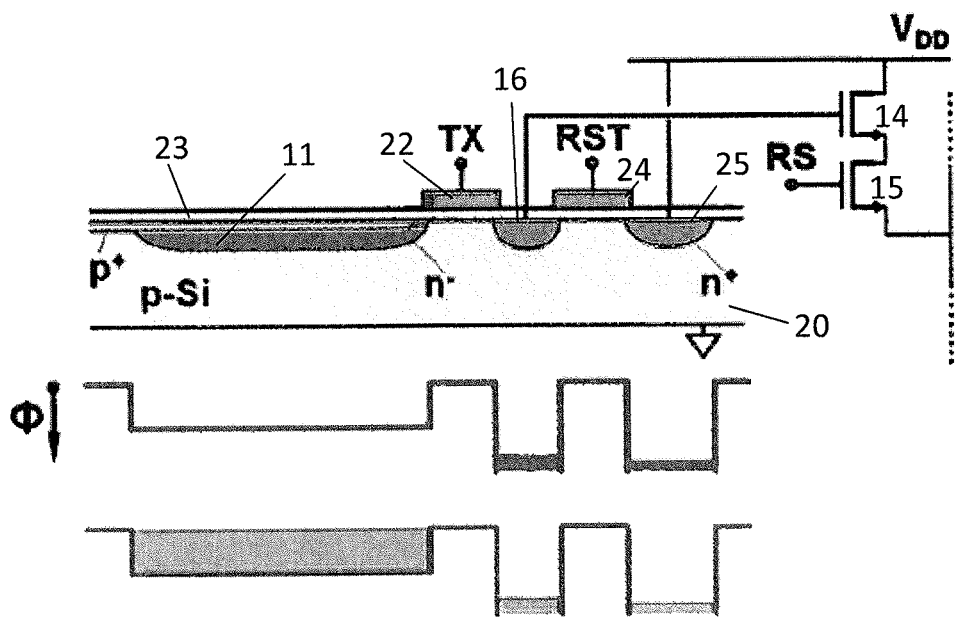
FIG. 2 – PRIOR ART

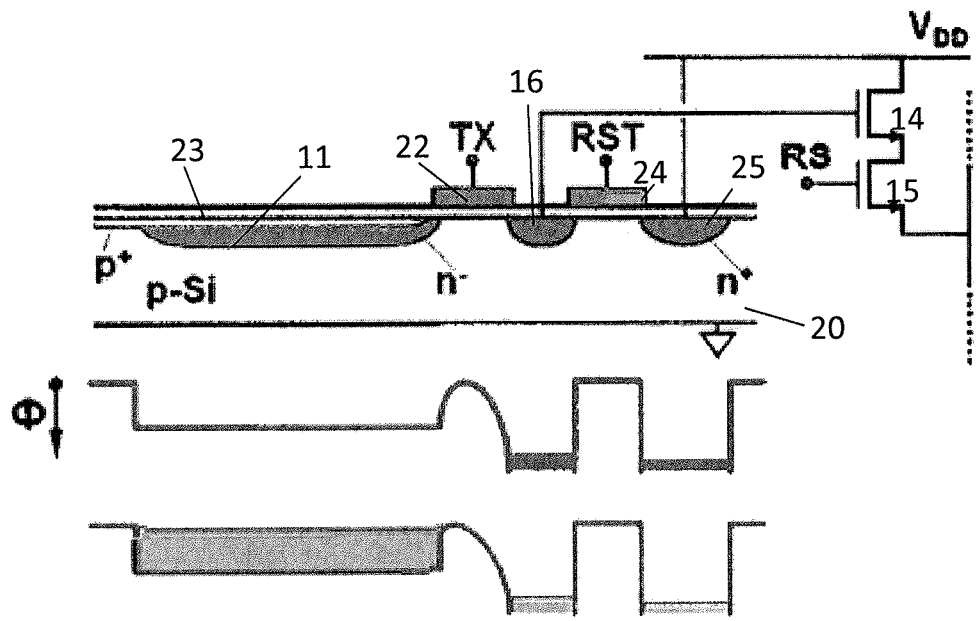
FIG. 3 – PRIOR ART
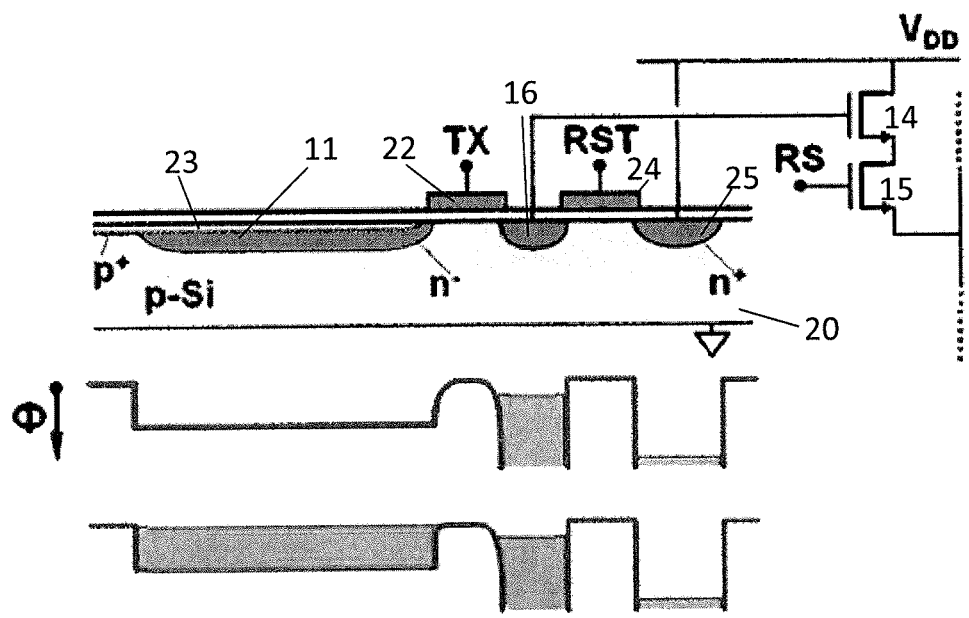
FIG. 4

ARRAY OF PIXELS WITH GOOD DYNAMIC RANGE

FIELD OF THE INVENTION

The present invention relates to image sensing, such as medical imaging, automotive imaging, machine vision, night vision, digital photography or digital camcorder imaging. The present invention relates to devices and methods for detection of radiation, and more particularly to devices and methods for detection of radiation with improved dynamic range.

BACKGROUND OF THE INVENTION

One type of image sensor is an active pixel sensor (APS). APS image sensors are typically fabricated using metal oxide semiconductor (MOS) processing technology, in particular for example Complementary Metal Oxide Semiconductor (CMOS) processing technology, and are typically referred to as (C)MOS image sensors or contact image sensors (CIS). CMOS image sensors sense light by converting incident radiation (photons) into electronic charge (electrons) via the photoelectric effect. CMOS image sensors typically include a photoreceptor (e.g. photodiode) and several CMOS transistors for each pixel.

Existing CMOS image sensors include, but are not limited to, three-transistor (3T) and four-transistor (4T) pixel implementations. Pixel implementations with more than four transistors have also been implemented. The pixel circuits in this type of image sensors typically include a source follower transistor that is used to buffer the photoreceptor voltage onto a column line.

An existing pixel configuration is illustrated in FIG. 1. FIG. 1 illustrates, as an example only, a 4T pixel 10 for a CMOS image sensor. All transistors in the pixel are MOS transistors. The pixel 10 illustrated in FIG. 1 comprises a photoreceptor 11, in the example illustrated a pinned photodiode PPD, for converting impinging radiation into electronic charge. The pixel 10 furthermore includes a sample and hold transistor 12 for transferring charge generated by the photoreceptor 11 towards a sense node in the form of a floating diffusion 16, a reset transistor 13 for resetting the sense node to a starting value, a source follower transistor 14 for converting the transferred charge into a voltage and a select transistor 15 for actually putting that voltage onto a column line.

FIG. 2 shows a cross-section of such classical 4T or pinned photodiode pixel. In a substrate 20, for example a substrate of a first type, e.g. p-type, a photoreceptor, e.g. a photodiode 11, is provided. This photodiode 11 may for example be a lowly doped region of a second type different from the first type, such as a region with an implanted dopant dose of $10^{16}/cm^3$ or lower, e.g. an n-region. The photodiode 11 is pinned by means of a pinning layer 21, for example a highly doped region of the first type, such as a region with an implanted dopant dose of $10^{18}/cm^3$ or higher, e.g. a p+ region. The sample and hold transistor 12 is formed by a control electrode, e.g. a transfer gate 22, formed on an insulating layer 23 on a major surface of the substrate 20. A first major electrode of the sample and hold transistor 12 is formed by the photodiode region 11, and a second major electrode of the sample and hold transistor 12 is formed by the floating diffusion 16. The reset transistor is formed by a control electrode, e.g. a reset gate 24, formed on the insulating layer 23 of the major surface of the substrate 20. A first major electrode of the reset transistor 13 is formed by the floating diffusion 16, and a second major electrode of the reset transistor 13 is formed by a highly doped contact region 25 of the second type, such as a region with an implanted dopant dose of $10^{18}/cm^2$ or higher, e.g. an n+ region. The contact region is connected to a power supply $V_{DD}$. The floating diffusion 16 is connected to a control electrode, e.g. gate, of the source follower transistor 14, of which a first major electrode, e.g. a drain, is connected to the power supply $V_{DD}$ as well. The second major electrode, e.g. source, of the source follower transistor 14 is connected to a first major electrode, e.g. the drain, of the select transistor 15, and the second major electrode, e.g. the source, of the select transistor 15 is connected to an output bus 26.

At the bottom of FIG. 2, two (idealized) potential diagrams of the structure illustrated are shown: one for an empty photodiode 11 and one for a completely filled photodiode 11. It is to be noted that the positive direction of the potential is indicated downwards.

The first potential diagram shows the situation for the case where the floating diffusion 16 is reset, and the pinned photodiode 11 is completely empty. The second potential diagram has a completely filled photodiode 11, while the floating diffusion 16 is still in the reset mode. As can be understood, the possible charge content of the pinned photodiode 11 is proportional to the area of the photodiode 11 multiplied by the depth of the pinned photodiode 11. The latter is defined as the potential difference between the bottom of the pinned photodiode and the potential underneath the transfer gate 22.

This "possible charge content" of the pinned photodiode 11 is also called the full-well capacity of the pinned photodiode 11. It is the largest charge the pixel can hold before going into saturation. In simple terms, this full well capacity is defined by the width of the pinned photodiode (very often close to the width of the pixel), the length of the pinned photodiode (very often close to the length or height of the pixel), and the depth of the photodiode (very often close to 1.5 V). The depth of the photodiode is the difference in voltage between the fully depleted photodiode and the barrier towards the floating diffusion, being the voltage underneath the transfer gate 22.

The full-well capacity of image sensors in general, and of the pinned photodiodes in particular, plays a dominant role in the definition of the dynamic range of imagers. Especially in digital still applications in combination with small pixels, the dynamic range may be low.

EP1178674 describes a solid state pickup device and camera system in which unit pixels each including a photodiode, a transfer transistor for transferring the signal of the photodiode to a floating node, an amplifying transistor for outputting the signal of the floating node to a vertical signal line, and a reset transistor for resetting the floating node are arranged in a matrix form. A P-type MOS transistor is connected between a wire to which a main electrode of the reset transistor at the opposite side to the floating node is connected, and a driving circuit for selectively applying a reset voltage to the wire. When a reset voltage is output from the driving circuit, the P-type MOS transistor is conducting to thereby apply the reset voltage to the wire. The reset voltage is supplied through the reset transistor to the floating node to thereby reset the potential of the node concerned. On the other hand, when no reset voltage is output from the driving circuit, the channel voltage of the P-type MOS transistor is applied to the wire. When the reset transistor is conducting, the potential of the floating node is determined by the channel voltage of the P-type MOS transistor, and thus is not equal to 0 V. Therefore, leakage of charges from the floating node through the transfer transistor to the photoelectrical conversion element can be prevented.

SUMMARY OF THE INVENTION

It is an object of embodiments of the present invention to provide an array of pixels with good dynamic range, and a method for generating an image signal with good dynamic range.

The above objective is accomplished by a method and device according to embodiments of the present invention. To maintain the dynamic range up to a pre-determined minimum specification, or even to increase the dynamic range, in accordance with embodiments of the present invention, the full well capacity of the pinned photodiode is controlled.

In one aspect, the present invention provides an array comprising a plurality of pixels logically arranged in rows and columns, the pixels comprising a photoreceptor for converting impinging radiation into electronic charge, a transfer element for transferring the electronic charge towards a sense node, a reset transistor for resetting the sense node, a source follower for converting the electronic charge onto the sense node into a voltage, a select transistor for outputting the voltage as a pixel signal, and means adapted for biasing the sense nodes at a low voltage lower than a reset voltage which is meant to initialise the photoreceptor, e.g. a low voltage between about 0.25 V and about 1.0 V, during integration of impinging radiation on the photoreceptors. The reset transistor of at least one pixel is coupled with one main electrode to the gate of the reset transistor of another pixel.

In particular embodiments, the reset transistors of all pixels of a predetermined row in the array may be coupled with one of their main electrodes to the gates of reset transistors of another row in the array. In particular embodiments, the reset transistors of all pixels of a particular row in the array may be coupled to the first supply voltage.

An array according to embodiments of the present invention may furthermore comprise a further biasing means for pulsing a gate of the transfer element to a negative value during resetting of the sense node.

An array according to embodiments of the present invention may comprise a plurality of cells logically arranged in rows and columns. In such cases, a cell comprises multiple photoreceptors for converting impinging radiation into electronic charge, a transfer element for each photoreceptor for transferring the electronic charge towards a common sense node, a single reset transistor for resetting the common sense node, means for converting the electronic charge onto the common sense node into a voltage, and for outputting the voltage as an electrical signal, and means adapted for biasing the sense node in the cells at a low voltage lower than a reset voltage which is meant to initialise the photoreceptors, during integration of impinging radiation on the photoreceptors. A cell thus is a combination of a plurality of photoreceptors and transfer elements as in previous embodiments, coupled to a single sense node, a single reset transistor, a single means for converting the electronic charge onto the common sense node into a voltage and for outputting the voltage as an electrical signal, and single means adapted for biasing, during integration of impinging radiation on the photoreceptors, the common sense node at a low voltage lower than a reset voltage meant to initialise the photoreceptors. According to embodiments of the present invention, the single reset transistor of at least one cell is coupled with one main electrode to the gate of the reset transistor of another cell.

This embodiment is advantageous for increasing the fill factor of the array architecture.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 1 schematically illustrates a classical 4T pixel.

FIG. 2 illustrates a cross-section of a classical 4T pixel, together with idealized potential diagrams for an empty photodiode and a completely filled photodiode.

FIG. 3 illustrates a cross-section of a classical 4T pixel, together with more realistic potential diagrams for an empty photodiode and a completely filled photodiode.

FIG. 4 illustrates a cross-section of a 4T pixel in accordance with embodiments of the present invention, together with corresponding potential diagrams for an empty photodiode and a completely filled photodiode.

Figure 5:
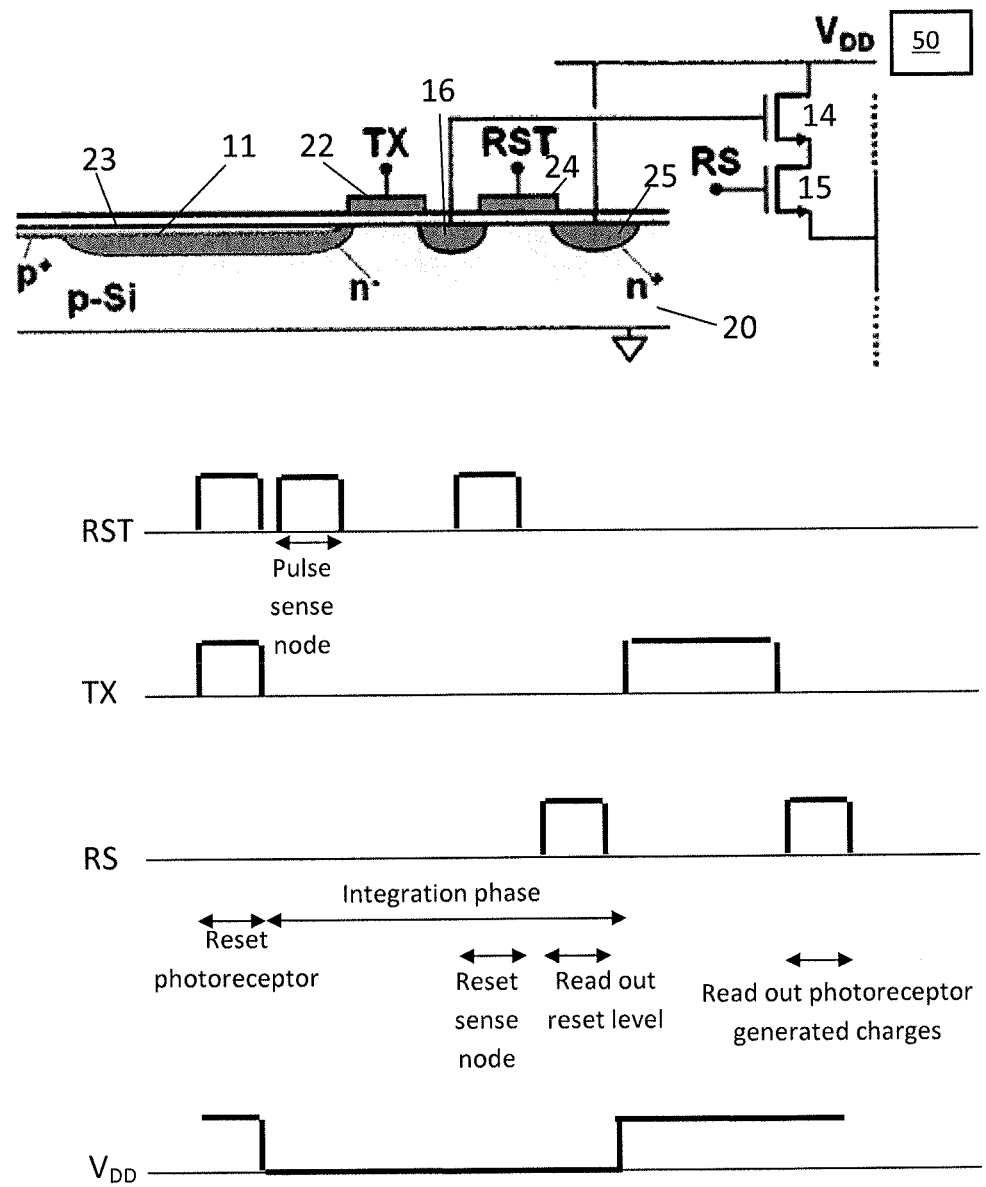
FIG. 5 illustrates a cross-section of a 4T pixel in accordance with a first embodiment of the present invention, with one example of operational timing diagrams.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to an image sensor, reference is made to a device which converts radiation, for example visible light, infrared radiation, ultraviolet radiation or x-ray radiation to a signal or plurality of signals, e.g. by photoelectric conversion, in order to encode a spatial distribution of a property of this radiation, e.g. intensity as function of location on an imaging plane of the image sensor. Such image sensor may typically comprise a plurality of pixel elements, e.g. arranged in an array, for determining this property of the radiation at a plurality of locations. For example, an image sensor may comprise a charged coupled device (CCD), which accumulates a small electrical charge in a pixel element when light impinges on this element. These accumulated charges may be converted to a voltage during a read-out phase, e.g. in which all pixel elements are read out sequentially. Additional circuitry may be provided to further encode these voltage levels into digital information. In another example, an image sensor may comprise a complementary metal oxide semiconductor (CMOS) imaging chip, a type of active pixel sensor made using the CMOS semiconductor process. In a CMOS imaging sensor, each pixel element, e.g. photosensor, is provided with integrated semiconductor circuitry, e.g. in the immediate vicinity of the pixel element, to convert the light energy received by the pixel element to a voltage for read-out. This reduces the electrical path length between the pixel element and read-out circuitry compared to a CCD sensor, but increases the manufacturing complexity.

Embodiments of the present invention relate to an image sensor, for example but not limited to a CMOS imager, comprising an array of pixels for detecting radiation. Typically, in such array the pixels are organized in the array in rows and columns. The terms "column" and "row" are used to describe sets of array elements which are linked together. The linking can be in the form of a Cartesian array of rows and columns, however, the present invention is not limited thereto. Also non-Cartesian arrays may be constructed and are included within the scope of the invention. Accordingly the terms "row" and "column" should be interpreted widely. To facilitate in this wide interpretation, there may be referred to "logically organised rows and columns". For example, the rows may be circles and the columns radii of these circles and the circles and radii are described in this invention as "logically organised" rows and columns. By this is meant that sets of pixels are linked together in a topologically linear intersecting manner; however, that the physical or topographical arrangement need not be so. Throughout this description, the terms "horizontal" and "vertical" (related to the terms "row" and "column" respectively) are used to provide a co-ordinate system and for ease of explanation only. They do not need to, but may, refer to an actual physical direction of the device.

As will be understood by those skilled in the art, columns and rows can be easily interchanged and it is intended in this disclosure that these terms be interchangeable. Irrespective of its physical direction, a "column" is meant to indicate a first direction in an array of pixels, for example along which neighbouring pixels are arranged which are typically read out in subsequent scan operations. A "row" indicates a second direction along which neighbouring pixels are arranged which are for example typically read out simultaneously. Row direction and column direction are different directions, for example orthogonal directions.

Where in embodiments of the present invention reference is made to a pixel, reference is made to a location of the image sensor, capable of encoding a property of impinging radiation.

Where in embodiments of the present invention reference is made to a floating diffusion, reference is made to a sense node in a pixel for detecting a charge packet and converting this into a voltage. This is a region in semiconductor material electrically isolated from all other nodes. There is no metal contact to this region onto which external voltages are imposed, hence its potential is solely determined by the amount of charge stored in it, its capacitance and the reset voltage. A charge packet that is generated by a photoreceptor by conversion of impinging radiation is dumped at the floating diffusion for readout.

It is to be noted that the situation as depicted in FIG. 2 is a kind of idealized situation. In reality, the potential from region to region does not actually change like a square wave, but changes rather smoothly. Furthermore, electrons stored in the pinned photodiode do have some thermal energy, and they can jump over a voltage barrier of (maximum) 0.4 V. So in reality it is not the voltage difference between the voltage in the empty photodiode and the voltage underneath the transfer gate 22 that defines the charge content, but actually it can be even 0.4 V lower. This effect strongly depends on temperature, on the length of the transfer gate 22, and on the time the electrons have available to jump over such a barrier of 0.4 V.

FIG. 3 illustrates a more realistic situation underneath the transfer gate 22 (for ease of illustration the other potential curves are kept square-waved, although a similar effect takes place there). As can be seen from this illustration, the width of the potential barrier underneath the transfer gate 22 is much smaller for a fully filled pinned photodiode in comparison to an empty pinned photodiode. Although the pinned photodiode is shown as completely filled in FIG. 3, the reality will be different: all electrons that are situated at a potential less than 0.4 V above the transfer gate barrier can or will easily jump over the barrier towards the floating diffusion 16. In this way, the full capacity of the pinned photodiode will be drastically reduced.

It will be pretty difficult, not to say impossible, to solve this problem. However, the present invention provides a solution to at least minimize the problem.

In a first aspect, the present invention provides a pixel comprising
 a photoreceptor for converting impinging radiation into an electronic charge,
 a transfer element for transferring the electronic charge towards a sense node,
 a source follower for converting the electronic charge onto the sense node into a voltage, and
 a select transistor for outputting the voltage as a pixel signal.

A pixel according to embodiments of the present invention further comprises first biasing means adapted for biasing the sense node at a low voltage, between about 0.25 V and about 1.0 V, e.g. a voltage of 0.5 V, during integration of impinging radiation on the photoreceptor.

By biasing the sense node at a low voltage during integration of impinging radiation on the photoreceptor, the potential barrier underneath the transfer gate 22 will be made as long as possible, and the electrons will have a lower chance to jump across the larger barrier. The low voltage needs to be high enough to prevent electrons from jumping from the floating diffusion 16 into the pinned photodiode, and low enough to generate a long potential barrier between the pinned photodiode and the floating diffusion. This situation is illustrated in FIG. 4. As can be seen from this drawing, the potential barrier underneath the transfer gate 22 is larger than in the previous situation with no low voltage being applied to the floating gate during integration of the impinging radiation on the photoreceptor. Moreover, during integration, i.e. when the pinned photodiode gets filled, the barrier is even getting larger. In this way, it will hamper the electrons to easily jump from the pinned photo-diode 11 into the floating diffusion 16. As a consequence, the full-well capacity and hence the dynamic range are increased.

Different implementations can be given of biasing the floating diffusion at a low voltage during the integration cycle.

In particular embodiments, the source follower 14 of the pixel comprises a transistor with two main electrodes, e.g. a source and a drain, and one control electrode. One of the main electrodes, e.g. the drain, is coupled to a first supply voltage $V_{DD}$. The control electrode is electrically coupled to the floating diffusion 16. The pixel furthermore comprises a reset transistor 13 for resetting the floating diffusion. The reset transistor 13 also comprises two main electrodes, e.g. a drain and a source, of which one, e.g. the drain, is connected to the first supply voltage $V_{DD}$, and the other one, e.g. the source, is connected to the floating diffusion 16. The reset transistor 13 also comprises a control electrode, to which a reset signal RST may be applied, for switching on the reset transistor 13, so as to actually reset the floating diffusion 16. In this embodiment, the first biasing means adapted for biasing the sense node at a low voltage during integration of impinging radiation on the photoreceptor 11 comprises a controller 50 adapted for pulsing the first supply voltage $V_{DD}$ to the low voltage during the integration cycle.

In operation, as diagrammatically illustrated in the example of FIG. 5, first the pixel is, or all pixels in a particular row of an array of pixels are being reset. This may be done by setting the reset line RST and the transfer line TX associated with that pixel or that particular row of pixels to high, e.g. equal to or above $V_{DD}$. Setting the reset line RST high turns on the reset transistor 13, and setting the transfer line TX high turns on the sample and hold transistor 12, and this sets the voltage across the photoreceptor 11 to a fixed starting value.

The reset line RST and the TX signal are then set to low (e.g. ground), thereby turning off reset transistor 13 and turning off sample and hold transistor 12 and beginning an integration phase. While the reset line RST and the transfer line TX are low, pixel 10 integrates the amount of radiation focused onto photoreceptor 11, and photoreceptor 11 discharges from the reset level downward. At the end of the integration phase, the reset line RST is activated again to reset the sense node by means of the reset transistor 13. After closing the reset transistor 13, the voltage present at the sense node is sampled and stored in the analog domain. Next the transfer line TX is set to high to start the readout phase of the radiation-generated information. Setting the transfer line TX to high turns on sample and hold transistor 12, and causes the charge on the photoreceptor 11 to be transferred to a parasitic capacitance at the node 16 connected to the gate of the source follower transistor 14. The transfer line TX is then set to low, thereby turning off sample and hold transistor 12. The voltage delivered by the source follower 14 is sampled again, by setting the row select line RS to high, and stored in the analog domain.

It will be clear for a person skilled in the art that the operational mode as illustrated with respect to FIG. 5 is an example only, and is not intended to be limiting for the present invention. Different pixels may have different operational principles, but even particular pixels may have different operational modes.

For typical readout of pixel information of pixels on a row of the array, the row select line RS would be set to high (e.g. VDD), thus connecting each source follower transistor 14 of the row to its associated column line for reading out the pixel information of that line.

In accordance with embodiments of the present invention, during the integration phase, i.e. while the photoreceptor 11 of the pixel accumulates impinging charges, the first supply voltage is pulsed to a low voltage, e.g. 0.5 V. During the normal readout sequence of the pixel, the first supply voltage $V_{DD}$ is pulsed to a high voltage, e.g. 3.3 V. The reset of the floating diffusion 16 is activated while the first supply voltage $V_{DD}$ is pulsed to the low voltage needed for biasing the floating diffusion 16. Hereto, the reset transistor 13 is turned on by setting the reset line RST to high, e.g. equal to or above $V_{DD}$. It is to be noted that in the embodiment illustrated three pulses are applied to the reset line, thus turning the reset transistor 13 on each time. This is required for digital still mode. However, for video mode, where 50 pictures per second are taken, the first and the third pulse on the reset line can be one single pulse, hence the first reset pulse for resetting the photoreceptor is not required, as the transfer of previously captured information automatically resets the photoreceptor for a next integration.

This implementation requires the pulsing of the first supply line $V_{DD}$, which can introduce some other nasty side-effects.

Figure 6:
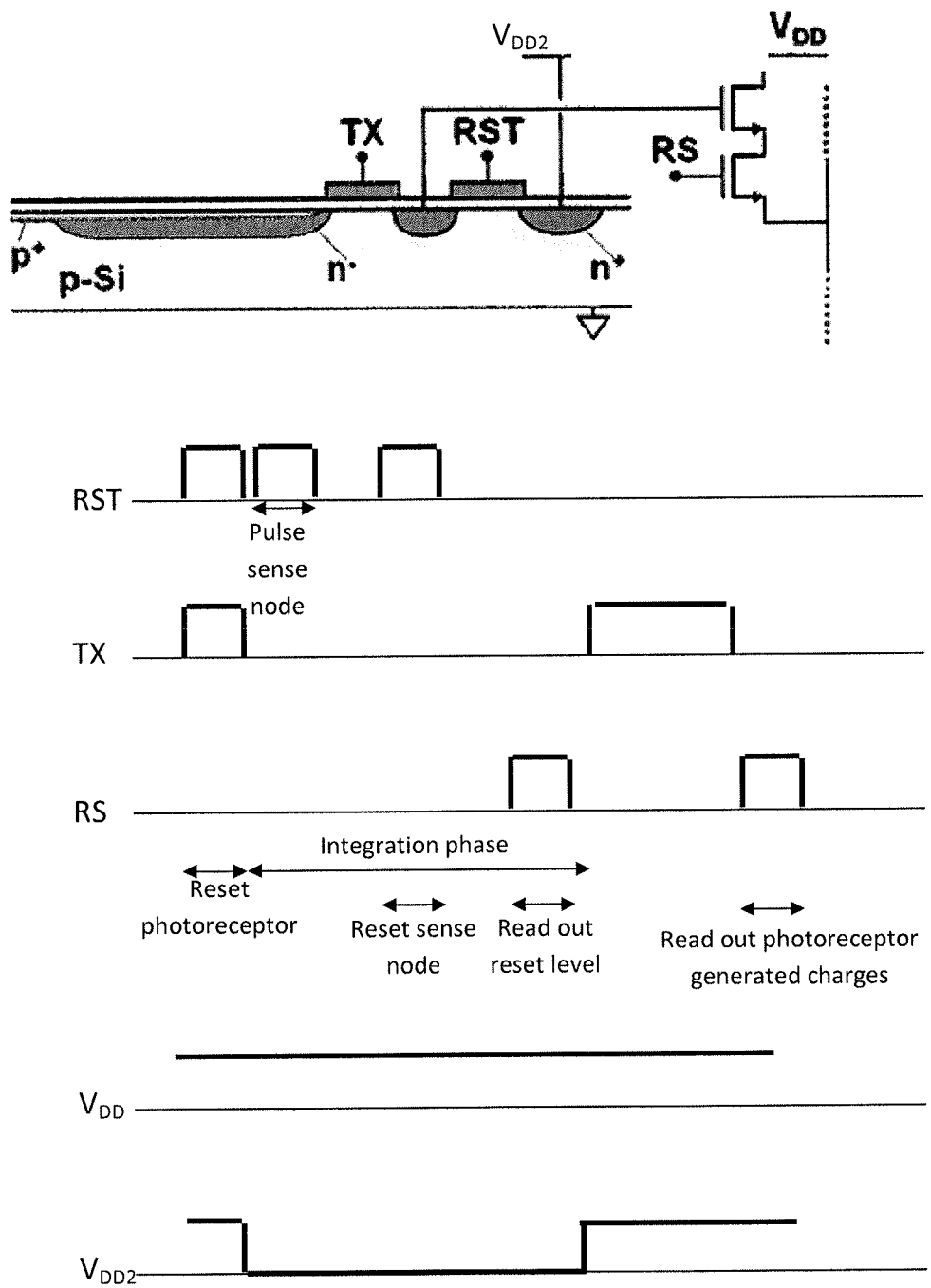
FIG. 6 illustrates a cross-section of a 4T pixel in accordance with a second embodiment of the present invention, with one example of operational timing diagrams.

In other embodiments, as illustrated in FIG. 6, a reset supply line $V_{DD2}$ may be decoupled from the first supply line $V_{DD}$. The first supply line $V_{DD}$ may remain at a high voltage all the time.

The operation may be as diagrammatically illustrated in the example of FIG. 6, and as described in detail with reference to FIG. 5, except for the pulsing of $V_{DD}$. In the case of the embodiment illustrated in FIG. 6, during reset of the photoreceptor 11, the reset supply line $V_{DD2}$ may be set to a high voltage. After having reset the photoreceptor 11, the integration phase starts. At that moment, the sense node 16 may be pulsed to a low voltage. This may be done by both turning on the reset transistor 13 by setting the reset line RST to high, e.g. equal to or above $V_{DD}$, and at substantially the same time pulsing the second supply line $V_{DD2}$ to the low voltage, e.g. between 0.25 V and 1.0 V such as for example 0.5 V. During the integration phase the floating diffusion is held at the low voltage.

After the normal readout sequence of the pixel, the reset is activated while the reset drain of the reset transistor is pulsed to the low voltage needed for biasing the floating diffusion. This implementation does need an extra metal connection into the pixel, for providing the signal to the second supply line $V_{DD2}$.

Yet another possibility can be implemented only in an array of pixels. Typically, the pixels are organized in the array in rows and columns. Irrespective of its physical direction, a "column" is meant to indicate a first direction in an array of pixels, for example along which neighbouring pixels are arranged which are typically read out in subsequent scan operations. A "row" indicates a second direction along which neighbouring pixels are arranged which are for example typically read out simultaneously. Row direction and column direction are different directions, for example orthogonal directions.

In such array, a major electrode of the reset transistor 13, e.g. the reset drain, of the pixels on one row may be decoupled from the supply line $V_{DD}$ and may be connected to the reset gate 24 of pixels of another line, e.g. a previous line. For example pixels on a same column may be connected to one another this way. Such implementation is illustrated in FIG. 7.

In this way no extra lines need to be added, neither a pulsing of the power lines is required. The only difference with a classical 4T pixel is an extra pulse of the reset gate, as illustrated in the operational diagrams at the bottom of FIG. 7.

Figure 7:
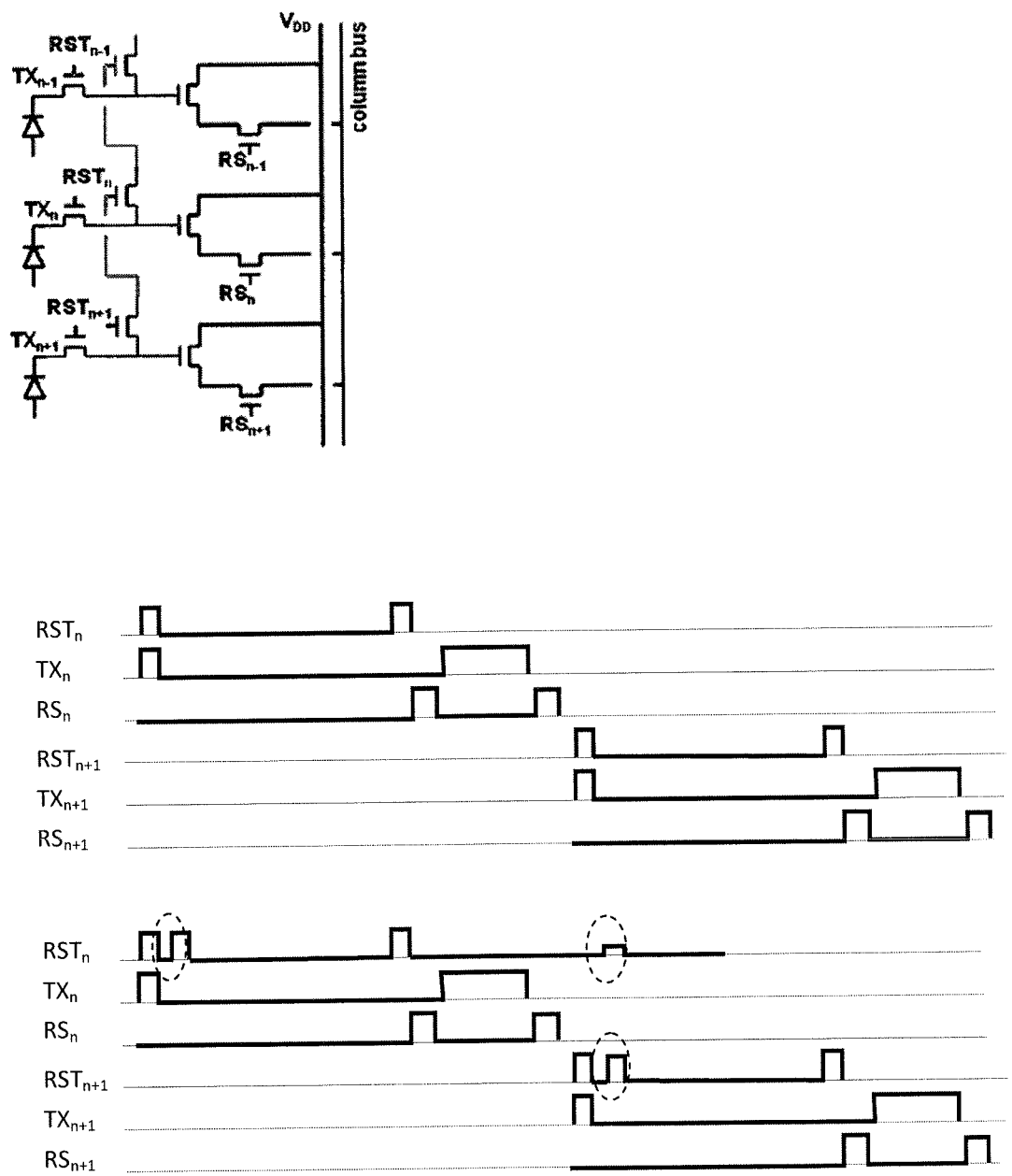
FIG. 7 schematically illustrates a part of an array comprising 4T pixels in accordance with a third embodiment of the present invention, with one example of operational timing diagrams.

At the top part of FIG. 7, an exemplary pixel, e.g. a 4T pixel, is shown in which the reset pulse has a double function: resetting the gate of line n and resetting the drain voltage of line n+1. The timing diagrams are shown at the bottom part of FIG. 7. The top diagram is for the classical 4T pixel as illustrated in FIG. 1 to FIG. 3, the bottom diagram for the one as proposed in accordance with embodiments of the present invention. In the bottom timing diagram, the changes from the classical 4T pixel to the new one in accordance with embodiments of the present invention are indicated by means of encircled pulses. The small pulse on the RST is to be noted, this corresponds to the low voltage needed to pre-charge the floating diffusion in accordance with embodiments of the present invention. The height of this pulse corresponds to the pre-charging voltage on the floating diffusion. Typically, the first line is or the first few lines are not actually used for imaging, in order to prevent transitional phenomena.

In operation, as diagrammatically illustrated in the example of FIG. 7, when considering the pixels of row n+1, first the pixels of this row are being reset. This may be done by setting the reset line $RST_{n+1}$ and the transfer line $TX_{n+1}$ associated with row n+1 to high, e.g. equal to or above $V_{DD}$. Setting the reset line $RST_{n+1}$ high turns on the reset transistor 13, and setting the transfer line $TX_{n+1}$ high turns on the sample and hold transistor 12, and this sets the voltage across the photoreceptors 11 of the pixels on row n+1 to a fixed starting value.

The $RST_{n+1}$ and the $TX_{n+1}$ signal are then set to low (e.g. ground), thereby turning off reset transistor 13 and turning off sample and hold transistor 12 and beginning an integration phase. At the start of the integration phase, in accordance with embodiments of the present invention, the sense node 16 is biased at a low voltage between about 0.25 V and about 1.0 V. This is done by setting the reset line $RST_{n+1}$ of row n+1 to high, e.g. equal to or above $V_{DD}$. At the same time, the reset line $RST_n$ of row n is pulsed to a low voltage between about 0.25 V and about 1.0 V. By the electrical connection between the drain of the reset transistor 13 of row n+1 to the gate of a corresponding reset transistor 13 of row n, the low voltage applied to the reset line $RST_n$ is transferred via the drain of reset transistor 13 of row n+1 to the sense node 16 of the pixel of row n+1, thus biasing that sense node to a low voltage.

While the reset line $RST_{n+1}$ and the transfer line $TX_{n+1}$ are low, and the sense node has been biased to a low voltage between about 0.25 V and about 1.0 V, the pixels of row n+1 integrate the amount of radiation focused onto their photoreceptors 11, and the photoreceptors 11 discharge from the reset level downward. At the end of the integration phase, the reset line $RST_{n+1}$ is activated again to reset the sense node by means of the reset transistor 13. After closing the reset transistor 13, the voltage present at the sense node is sampled and stored in the analog domain, by setting the row select line $RS_{n+1}$ to high. Next the transfer line $TX_{n+1}$ is set to high to start the readout phase of the radiation-generated information. Setting the transfer line to high turns on sample and hold transistor 12, and causes the charge on the photoreceptor 11 to be transferred to a parasitic capacitance at the node 16 connected to the gate of the source follower transistor 14. The transfer line $TX_{n+1}$ is then set to low, thereby turning off sample and hold transistor 12. The voltage delivered by the source follower 14 is sampled again, by setting the row select line $RS_{n+1}$ to high, and stored in the analog domain.

It will be clear for a person skilled in the art that the operational mode as illustrated with respect to FIG. 7 is an example only, and is not intended to be limiting for the present invention. Different pixels may have different operational principles, but even particular pixels may have different operational modes.

For typical readout of pixel information of pixels on a row of the array, the row select line RS would be set to high (e.g. VDD), thus connecting each source follower transistor 14 of the row to its associated column line for reading out the pixel information of that line.

In all embodiments illustrated, the floating diffusion of the pixel, e.g. the 4T pixel, always needs to be reset right before the transfer start. During this reset, the floating diffusion is typically raised to a predetermined value, e.g. 3.3 V (in hard reset mode), and the charge overflow from the photoreceptor 11, e.g. pinned photodiode, into the floating diffusion 16 will start over and again, because the voltage difference between the sense node and the voltage under the sample and hold transistor becomes too big. And this is exactly the effect that needs to be prevented.

To counteract this effect, in accordance with embodiments of the present invention the following solution is proposed: during the reset phase of the floating diffusion 16, the separation between the photoreceptor 11 and the floating diffusion 16 will be made much "harder" by pushing the transfer gate 22 slightly negative, e.g. at a voltage between about −0.25 V and about −1.0 V, e.g. −0.5 V. This will completely shield the floating diffusion 16 from the photoreceptor 11 and any charge leakage from the photoreceptor 11 to the floating diffusion 16 will be prevented. The transfer gate 22 is not pushed negative during the complete integration/exposure cycle, as this would interrupt the anti-blooming path from the photoreceptor 11 over the floating diffusion 16 towards the reset drain 25, which is not allowed during the normal integration/exposure period. Because the reset pulse for resetting the floating diffusion 16 is very short in time, a negative value on the transfer gate 22 during the time the reset pulse is active will not hamper the performance of the pixel.

Figure 8:
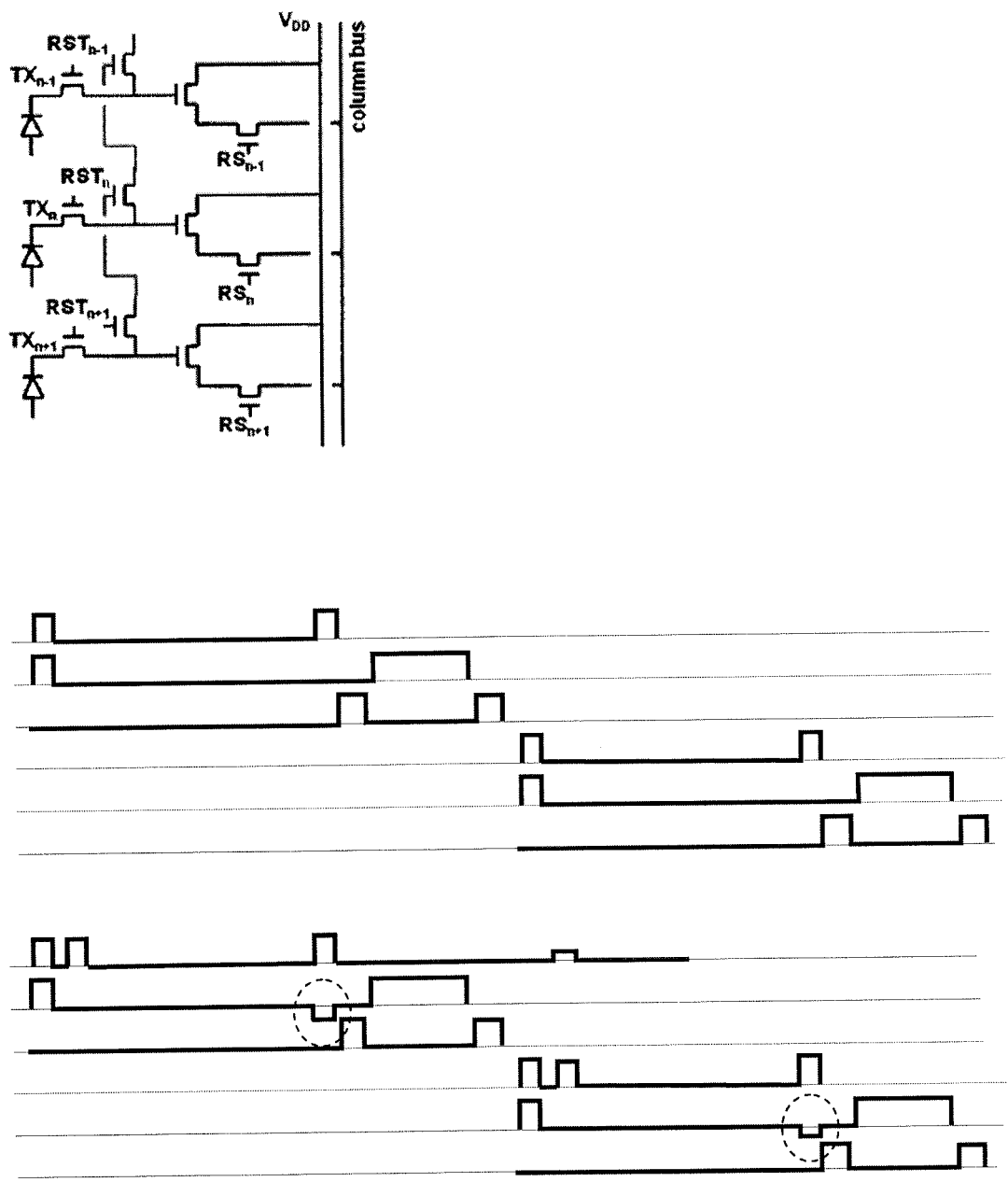
FIG. 8 schematically illustrates a part of an array comprising 4T pixels in accordance with a fourth embodiment of the present invention, with one example of operational timing diagrams.

This further optimization of the idea will result in a new timing scheme, as illustrated as an example only in FIG. 8. The timing scheme illustrated is basically the same as the one of FIG. 7, with the addition of a slight negative pulse on the transfer gate during the active reset of the floating diffusion. This, however, is not intended to be limiting for the present invention: the application of the negative pulse to the transfer gate 22 could as well be implemented in any of the other embodiments of the present invention.

An active CMOS pixel with a pinned photodiode is characterized by four transistors and five interconnections in each pixel, as illustrated in FIG. 1, and this complicated architecture results in a relatively low fill factor. It is clear that it is very hard to make pixels smaller than 3 based on the PPD concept. The in-pixel periphery consumes too much space.

Figure 9:
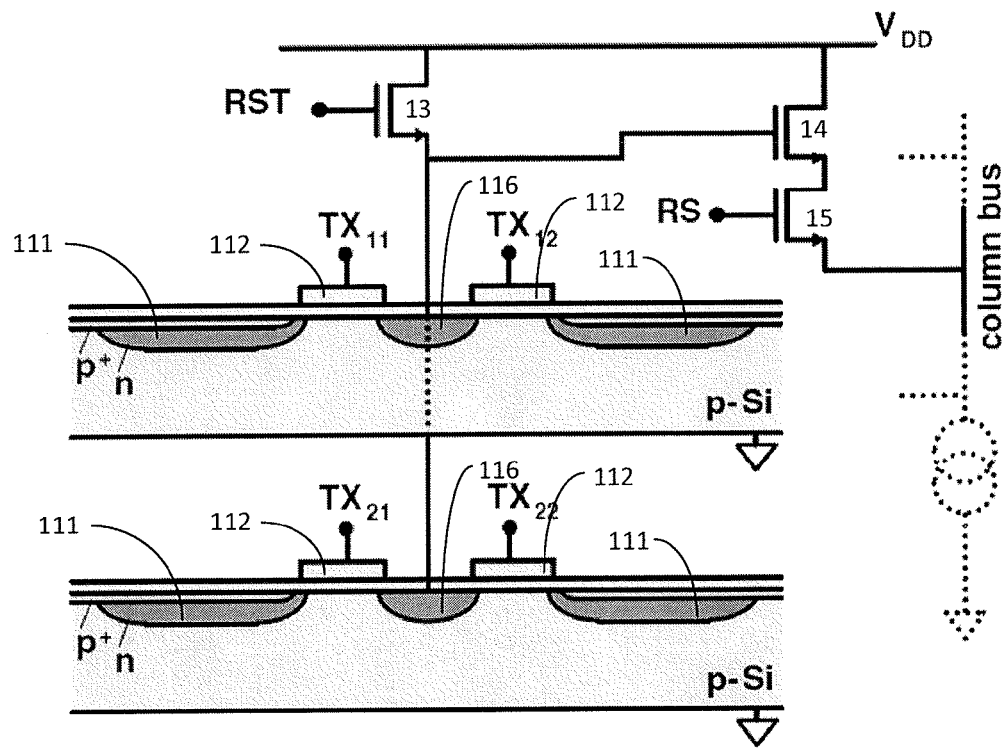
FIG. 9 schematically illustrates the shared pixel concept which may be applied to arrays of pixels according to embodiments of the present invention, wherein in the example illustrated 2×2 pinned photodiodes share the same in-pixel readout circuitry.

An answer to this issue can be found in the "shared pixel" concept: several neighboring pixels share the same output circuitry. The basic idea is illustrated in FIG. 9: a group of two by two pixels have in common the source-follower, the reset transistor, the addressing transistor and the readout node.

Next to the listed components, the cluster of pixels has four pinned photodiodes and four transfer gates. The timing of pixels becomes a bit more complicated, but the shared pixel architecture is now characterized by eight interconnects and seven transistors, resulting in two interconnects and 1.75 transistors per photodiode. The positive effect on the fill factor will be clear for a person skilled in the art.

Figure 10:
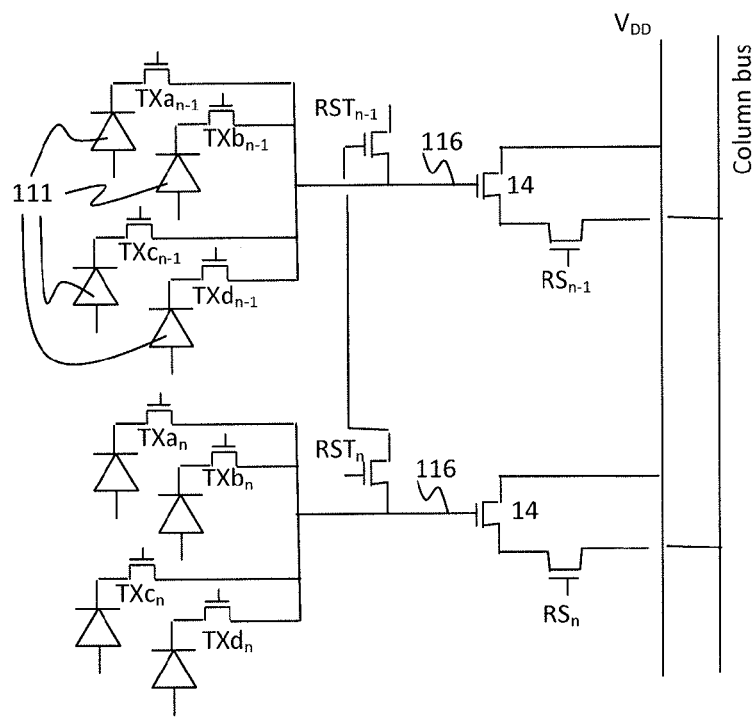
FIG. 10 schematically illustrates the shared pixel concept applied to an array structure in accordance with embodiments of the present invention.

It is particularly useful to apply the shared pixel concept to an array structure according to embodiments of the present invention. This is illustrated schematically in FIG. 10. Two cells are illustrated, each cell comprising a plurality of photoreceptors 111 (four in the embodiment illustrated), and each photoreceptor 111 comprising a transfer element $TXa_i$, $TXb_i$, $TXc_i$, $TXd_i$, i indicating the row where the cell can be found in the array, in the example illustrated row n−1 or row n. Each cell furthermore comprises a single sense node 116, a single reset transistor RST, for resetting the single sense node 116, i again indicating the row number of the respective cell, means 14 for converting the electronic charge on the single sense node 116, common to all photoreceptors 111 of the cell, into a voltage and for outputting the voltage as an electrical signal. This is called the shared pixel concept. In accordance with embodiments of the present invention, the array furthermore comprises means adapted for biasing, during integration of impinging radiation onto the photoreceptors 111, the sense node 116 at a low voltage lower than a reset voltage which is meant to initialize the photoreceptors 111. As illustrated in FIG. 10, the single reset transistor $RST_{n-1}$ of at least one cell is coupled with one main electrode to the gate of the single reset transistor $RST_n$ of another cell.

Operation of such shared pixel architecture in accordance with embodiments of the present invention is as set out above with respect to the "normal architecture", where each photoreceptor corresponds to a separate sense node.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

For example, it is possible to operate the invention in an embodiment wherein other pixels than the illustrated 4T pixels are used, such as for example 5T pixels which are as the illustrated 4T pixels provided with a further anti-blooming transistor, which makes the negative pulse as in FIG. 8 redundant; 6T or 7T pixels. Embodiments of the present invention may also be implemented in other suitable pixels, such as shared pixels with 2T, 1.75T, 1.5T or other transistor counts.

The invention claimed is:

1. An array comprising a plurality of pixels being logically arranged in rows and columns, the pixels comprising
   a photoreceptor for converting impinging radiation into electronic charge,
   a transfer element for transferring the electronic charge towards a sense node,
   a reset transistor for resetting the sense node,
   means for converting the electronic charge onto the sense node into a voltage, and for outputting the voltage as a pixel signal,
   means adapted for biasing the sense nodes at a low voltage lower than a reset voltage which is meant to initialize the photoreceptor, during integration of impinging radiation on the photoreceptors, wherein
   the means for converting and outputting comprise a source follower for converting the electronic charge, and a select transistor for outputting the voltage as a pixel signal, the reset transistor of at least one pixel is coupled with one main electrode to the gate of the reset transistor of another pixel, and the reset transistor of said at least one pixel is furthermore coupled with another main electrode to the sense node of the at least one pixel.

2. The array according to claim 1, wherein the reset transistors of all pixels of a predetermined row in the array are coupled with one of their main electrodes to the gates of reset transistors of another row in the array.

3. The array according to claim 2, wherein the reset transistors of all pixels of a particular row in the array are coupled to a supply voltage.

4. The array according to claim 1, furthermore comprising a further biasing means for pulsing a gate of the transfer element to a negative value during resetting of the sense node.

5. The array according to claim 1, wherein a plurality of photoreceptors, a transfer element for each photoreceptor, a single sense node, a single means for converting the electronic charge onto the sense node into a voltage and for outputting the voltage as a pixel signal, and a single means adapted for biasing, during integration of impinging radiation on the photoreceptors, the sense node at a low voltage lower than a reset voltage which is meant to initialise the photoreceptors are combined into a cell, the array comprising at least two cells, wherein the reset transistor of at least one cell is coupled with one main electrode to the gate of the reset transistor of another cell.

* * * * *